Figure 1:
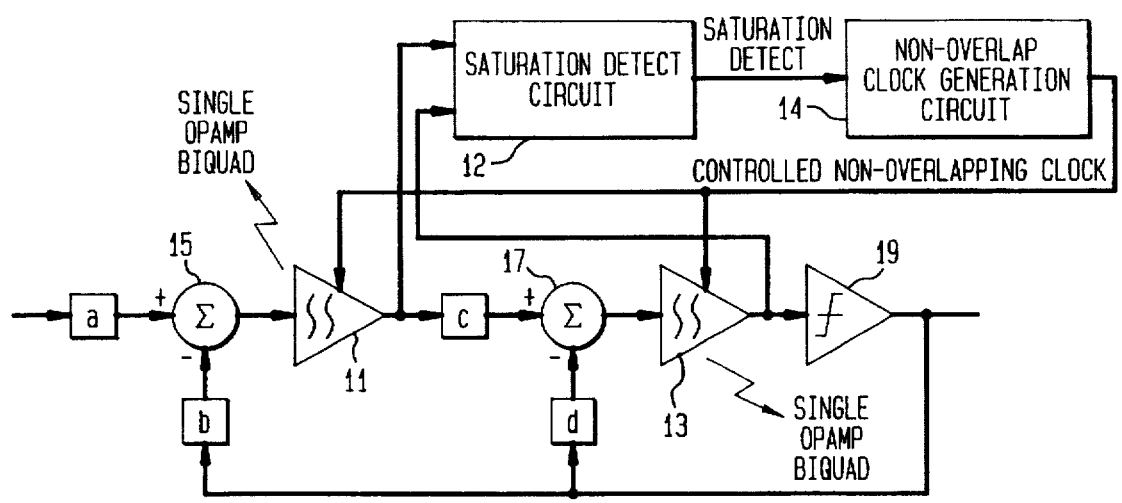

United States Patent [19]

Yu

[11] Patent Number: 5,793,811
[45] Date of Patent: Aug. 11, 1998

[54] STABILIZATION SCHEME OF DELTA-SIGMA MODULATOR

[75] Inventor: Chu-Chiao Yu, Hsinchu, Taiwan

[73] Assignee: Winbond Electronics Corporation, Hsinchu, Taiwan

[21] Appl. No.: 629,971

[22] Filed: Apr. 9, 1996

[51] Int. Cl.$^6$ ............................................. H04B 14/06
[52] U.S. Cl. ............................ 375/247; 341/143; 341/150
[58] Field of Search .............................. 375/247; 341/143, 341/150

[56] References Cited

U.S. PATENT DOCUMENTS

| | | | |
|---|---|---|---|
| 4,866,442 | 9/1989 | Steim et al. | 341/143 |
| 5,243,345 | 9/1993 | Naus et al. | 341/143 |
| 5,245,344 | 9/1993 | Sooch | 341/150 |
| 5,379,039 | 1/1995 | Charaska et al. | 341/143 |
| 5,446,460 | 8/1995 | Cabler | 341/143 |
| 5,461,381 | 10/1995 | Seaberg | 341/143 |
| 5,572,107 | 11/1996 | Koch et al. | 320/1 |
| 5,603,113 | 2/1997 | De Loe, Jr. | 455/234.1 |

*Primary Examiner*—Stephen Chin
*Assistant Examiner*—Mohammad Ghayour
*Attorney, Agent, or Firm*—Meltzer, Lippe, Goldstein, et al.

[57] ABSTRACT

An analog modulator employing Δ-Σ transformation and comprising timings generator, at least a single operational-amplifier (OP-amplifier) filter of Biquadratic transfer function and saturation detection circuit, is provided. This novel approach solves the stability issue by controlling the switching timings of the single operation-amplifier biquadratic filter in the Δ-Σ modulator. During normal operation, this high-order Δ-Σ modulator constructed by the single OP-amplifier biquadratic filter functions a third-order or fourth-order modulator. As unstable condition occurs, via the saturation detection circuit and timings generator, the third-order or the fourth-order modulator functionally converts into and performs as a stable Δ-Σ modulator of second-order. As a stable condition is restored after a recovery time, via controlling the timing signals, the modulator functionally resumes its normal function of third-order or fourth-order operation which has a high resolution.

4 Claims, 2 Drawing Sheets

STABILIZATION SCHEME OF DELTA-SIGMA MODULATOR

TECHNICAL FIELD OF INVENTION

The invention relates to a method for stabilizing a modulator of high-order transfer function.

BACKGROUND OF INVENTION $\Delta$-$\Sigma$ (Delta-Sigma) modulator has been widely employed in the analog/digital or digital/analog converters for applications in audio frequency range. To achieve higher resolution during conversion, modulator of higher-order transfer function is commonly used. However, when high-order $\Delta$-$\Sigma$ modulator, for instance, $\Delta$-$\Sigma$ modulator of above third-order (inclusive), is used, there accompanies a stability concern. In particular, as system is initially powered up or during other transient states, large DC current values or any input signals of high frequency render the high-order modulator in a unstable condition. In other words, these modulators of high-order are categorized as conditionally stable ones which enter unstable condition as the loop gain drops. Therefore, to use modulators of high-order, one has to solve the stability issue beforehand. To tackle such issue, technologies have been devised and such technologies have been allowed as U.S. Pat. Nos. 4,509,037 and 5,012,244. The former patent employs a clipper circuit to avoid an unstable condition in modulators of high-order and the latter uses a reset circuit and continuous time integrator to achieve the same purpose.

This invention, however, employs a novel and different approach to solve the unstability issue encountered in modulators of high-order.

SUMMARY OF INVENTION

The instant novel invention solves the stability issue of high-order $\Delta$-$\Sigma$ modulator by controlling the switching timings of a single operational-amplifier (OP-amplifier) biquadratic filter in the modulator. During normal operation, this high-order modulator constructed by the single OP-amplifier biquadratic filter functions as a third-order or fourth-order modulator which has a high resolution. However, as unstable condition occurs, via the saturation detection circuit and clock generation circuit, the third-order or the fourth-order modulator functionally converts into and performs as a stable modulator of second-order which has a lower resolution. As a stable condition is restored after a recovery time, via controlling the timing signals, the modulator functionally resumes its normal function of third-order or fourth-order $\Delta$-$\Sigma$ modulator.

The analog modulator comprises a timing generator, at least one single operational-amplifier filter of Biquadratic transfer function and saturation detection circuit.

The timing generator, responsive to a control signal, generates a plurality of switching timing signals.

The single operational-amplifier filter of Biquadratic transfer function, in response to the plurality of switching timing signals, selectively transforms into an integrator functionally.

The saturation detection circuit, in response to a saturation state of the single operational-amplifier filter, outputs the control signal to the timing generator.

When the modulator is unstable, the single operational-amplifier filter functionally transforms into the integrator which is inherent stable, and when the modulator comes back to stable state, the integrator functionally transforms into the single operational-amplifier filter of Biquadratic transfer function.

BRIEF DESCRIPTIONS OF THE DRAWINGS

FIG. 1 discloses the invention in functional blocks.

Figure 2:
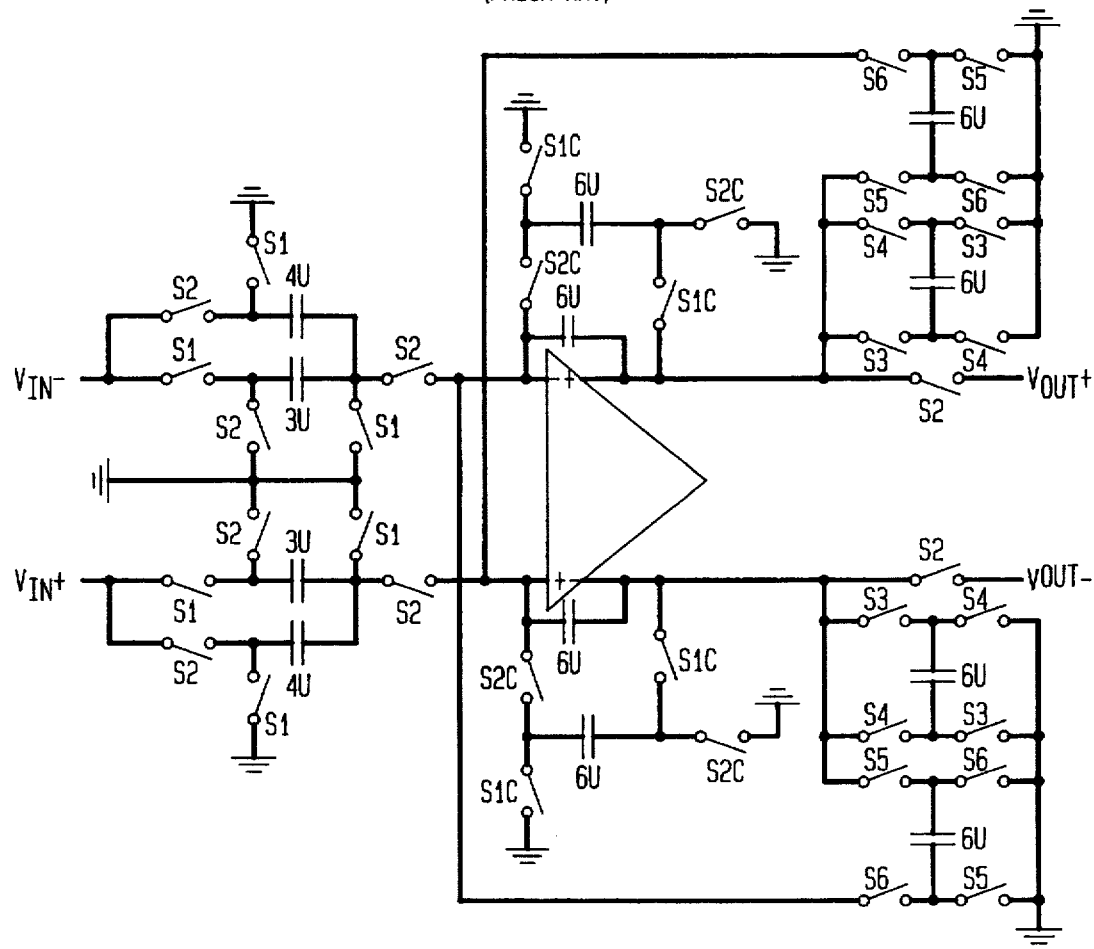

FIG. 2 discloses a conventional single OP-amplifier biquadratic filter.

Figure 3:
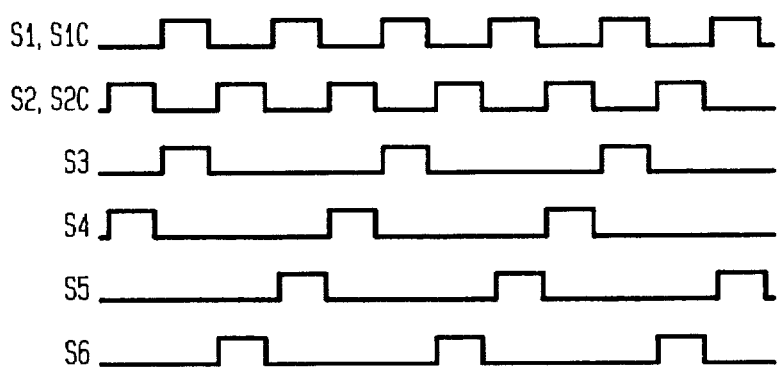

FIG. 3 discloses the switching timings which operate the circuit shown in FIG. 2.

Figure 4:
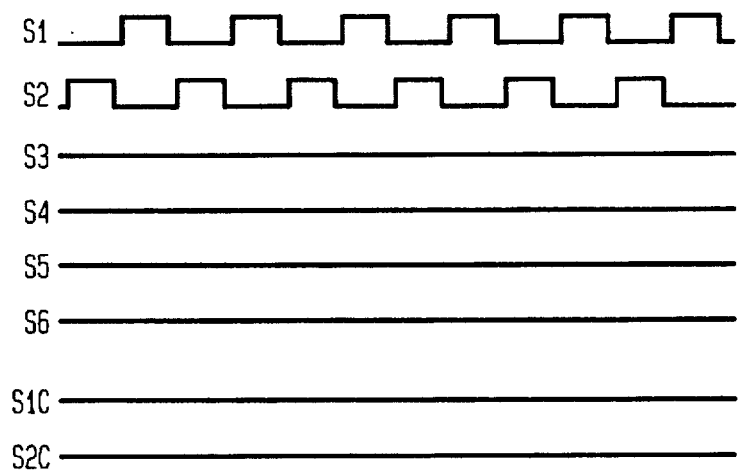

FIG. 4 discloses the switching timings which operate the single OP-amplifier biquadratic filter as the saturation condition is detected by the invention.

Figure 5:
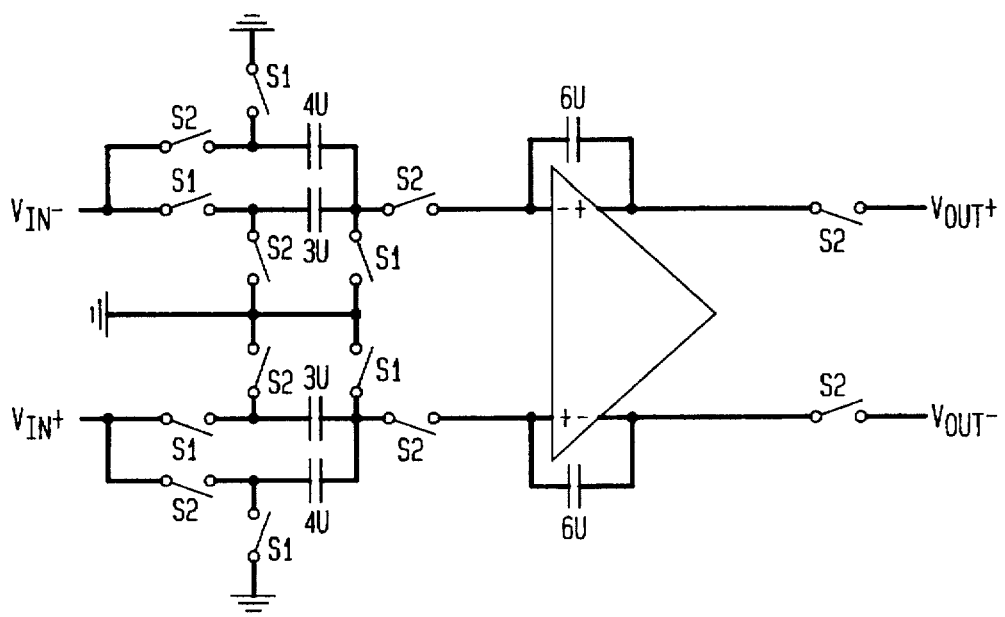

FIG. 5 discloses an integrator which is functionally equivalent to the single OP-amplifier biquadratic filter shown in FIG. 2 while the timing signals are such shown in FIG. 4.

DETAILED DESCRIPTIONS OF THE EMBODIMENT

As shown in FIG. 1, the preferred embodiment of invention including single OP-amplifier biquadratic filters 11, 13, summing nodes 15, 17, gain blocks a, b, c, d, quantitizer 19, saturation detection circuit 12 and non-overlap clocks generation circuit 14, is a $\Delta$-$\Sigma$ modulator of fourth-order. The input to the modulator is an analog signal and the output signal is a digital one. As well known in the arts, the output signal is feedback to the summing nodes 15, 17 to maintain the loop stability. It is to be noted, one of the single OP-amplifier biquadratic filters 11, 13 may be substituted by a conventional integrator of first-order to construct a $\Delta$-$\Sigma$ modulator of third-order. The single OP-amplifier biquadratic filters 11, 13 may be realized by a conventional switched-capacitor filter shown in FIG. 2 which is well known in the arts.

By controlling the switching timings to the corresponding switches in the filter shown in FIG. 2, the filter in the invention functions selectively as a single OP-amplifier biquadratic filter and a conventional first-order integrator. In particular, as the modulator is stable, the clocks generation circuit 14 produces the switching signals as shown in FIG. 3 to control the corresponding switches, and the invention operates as analog $\Delta$-$\Sigma$ modulator of fourth-order. As the modulator becomes or intends to be unstable, output of one or more operational amplifiers saturate, and the saturation detection circuit 12, in response thereto, generates a control signal to clocks generation circuit 14. The switching timing signals, as shown in FIG. 4, output from the clocks generation circuit 14 disable the corresponding switches SC1 SC2S3S4S5S6 in FIG. 2. In other words, switches SC1 SC2S3S4S5S6 are turned off such that the single OP-amplifier biquadratic filter functionally acts as a conventional integrator shown in FIG. 5 once the unstable condition is detected. During the period, the third-order (or fourth-order) $\Delta$-$\Sigma$ modulator is converted to operate as an inherently stable second-order $\Delta$-$\Sigma$ modulator.

After a predetermined amount of time elapses, the $\Delta$-$\Sigma$ modulator comes back to a stable condition and, responsive thereto, the clocks generation circuit 14 outputs again the switching timing signals shown in FIG. 3 to control the corresponding switches S1S2SC1SC2S3S4S5S6 such that the original third-order (or fourth-order) $\Delta$-$\Sigma$ modulator resumes.

The result of simulation of the invention shows, as the oversampling ratio is 128, the peak signal/noise ration is 104 dB, and the dynamic range reaches 110 dB.

What is claimed is:

1. An analog modulator employing Δ-Σ transformation, comprising:

timing generator, responsive to a control signal, for generating a plurality of switching timing signals;

at least a single operational amplifier filter of biquadratic transfer function, in response to the plurality of switching timing signals, selectively transforming into an integrator functionally;

saturation detection circuit, in response to a saturation state of the single operational amplifier filter, for outputting the control signal to the timing generator;

wherein, when the modulator is unstable, the single operational amplifier filter functionally transforms into the integrator which is inherent stable, and when the modulator comes back to a stable state, the integrator functionally transforms into the single operational amplifier filter of biquadratic transfer function.

2. The modulator as recited in claim 1, wherein the integrator is a first-order integrator.

3. A method for stabilizing operation of a higher order Δ-Σ modulator, the higher-order Δ–Σ modulator comprising at least one single operational amplifier filter of biquadratic transfer function and a timing generator, the method comprising:

(1) detecting if the modulator is in unstable state; and (2) if it is yes in step 1, the timing generator generating a plurality of switching timing signals to operate the modulator in state of an inherent stable second-order Δ-Σ modulator, by transforming the single operation amplifier filter of biquadratic transfer function into an integrator.

4. The modulator as recited in claim 3, wherein the integrator is a first-order integrator.

* * * * *